US008618431B2

(12) United States Patent
Lin et al.

(10) Patent No.: US 8,618,431 B2
(45) Date of Patent: Dec. 31, 2013

(54) TOUCH SENSING UNIT AND METHOD FOR MANUFACTURING THE SAME

(75) Inventors: Heng-Ju Lin, Tainan (TW); Wen-Yang Chang, Yunin County (TW)

(73) Assignee: Industrial Technology Research Institute, Hsinchu (TW)

( * ) Notice: Subject to any disclaimer, the term of this patent is extended or adjusted under 35 U.S.C. 154(b) by 459 days.

(21) Appl. No.: 13/110,925

(22) Filed: May 19, 2011

(65) Prior Publication Data

US 2012/0222948 A1  Sep. 6, 2012

(30) Foreign Application Priority Data

Mar. 1, 2011 (TW) .............................. 100106678 A (51) Int. Cl.
*H03K 17/975* (2006.01)
(52) U.S. Cl.
USPC .......................................... 200/600; 345/174
(58) Field of Classification Search
USPC ........... 200/600, 310–317, 46, 292, 511–512, 200/514; 29/622; 345/173–174; 174/250
See application file for complete search history.

(56) References Cited

U.S. PATENT DOCUMENTS

| 4,527,021 | A | 7/1985 | Morikawa et al. |
| 6,032,542 | A | 3/2000 | Warnick et al. |
| 7,064,561 | B2 | 6/2006 | Morimoto |
| 7,348,966 | B2 | 3/2008 | Hong et al. |
| 7,439,465 | B2 | 10/2008 | Parkinson |
| 2011/0148811 | A1* | 6/2011 | Kanehira et al. ............... 345/174 |
| 2012/0092279 | A1* | 4/2012 | Martin ........................... 345/173 |
| 2012/0162123 | A1* | 6/2012 | Kent et al. ...................... 345/174 |

OTHER PUBLICATIONS

Pan et al., A Flexible Full-body Tactile Sensor of Low Cost and Minimal connections, Systems, Man and Cybernetics, 2003. IEEE International Conference on, vol. 3, Oct. 5-8, 2003, pp. 2368-2373.
Hicks et al., Membrane Touch Switches: Thick-Film Materials Systems and Processing Options, Components, Hybrids, and Manufacturing Technology, IEEE Transactions on vol. 3 Issue 4, Dec. 1980, pp. 518-524.
Van Den Heever et al, Tactile Sensing Using Force Sensing Resistors and a Super-Resolution Algorithm, Sensors Journal, IEEE, vol. 9 Issue 1, Jan. 2009, pp. 29-35.

* cited by examiner

*Primary Examiner* — Edwin A. Leon
(74) *Attorney, Agent, or Firm* — Jianq Chyun IP Office (57) ABSTRACT

A touch sensing unit and a method for manufacturing the same are provided. The touch sensing unit includes a first substrate, a first electrode, a second substrate, a second electrode, a supporting layer, a third electrode and a sensing layer. The first electrode is disposed on the first substrate. The second substrate is disposed opposite to the first substrate. The first electrode is disposed between the first substrate and the second substrate. The second electrode is disposed on the second substrate, and the first electrode contacts the second electrode through a pressing motion. The supporting layer is disposed between the first substrate and the second substrate. The third electrode is disposed on the second substrate. The sensing layer has constant impedance and is disposed on the second substrate between the second electrode and the third electrode to electrically connect the second electrode and the third electrode.

21 Claims, 6 Drawing Sheets

TOUCH SENSING UNIT AND METHOD FOR MANUFACTURING THE SAME

CROSS-REFERENCE TO RELATED APPLICATION

This application claims the priority benefit of Taiwan application serial no. 100106678, filed Mar. 1, 2011. The entirety of the above-mentioned patent application is hereby incorporated by reference herein and made a part of this specification.

TECHNICAL FIELD

The disclosure relates to a touch sensing unit having constant, and a method for manufacturing the same.

BACKGROUND

The touch technology provides the advantages of humanistic interfaces and a variety of sensing operations, and therefore the touch technology is widely applied in input units of the electronic devices and sensing devices, such as sensing mattresses, interaction sensing mats and electronic whiteboards. Generally speaking, according to sensing theories, the touch technology can be classified into resistive touch, capacitive touch, optics touch, electromagnetic touch, and so on. Among them, the resistive touch technology is the mainstream in markets and extensively adopted.

Specifically, a resistive touch sensing device is composed of two stacking conductive layers, and the resistive material is dispersed in the two conductive layers. When the user touches the resistive touch sensing device, the conductive layer contacts the resistive material and a current loop is formed, so that the touch point is detected. However, when the conductive layer contacts the resistive material, the conductance therebetween is poor since the conductive layer and the resistive material are dissimilar materials. Accordingly, the sensitivity of the touch sensing device is lowered. In addition, when the conductive layer and the resistive material contact due to the external force, the contact therebetween is influenced by the contact area or load. Thus, the touch point may be determined incorrectly or shifted, and the accuracy of the touch sensing device is reduced. Hence, the complexity of the processing circuit is increased. Moreover, the conductive layer and the resistive material are worn when they contact, and thus the reliability of the touch sensing device is lowered.

SUMMARY

A method for manufacturing a touch sensing unit is introduced herein for obtaining a touch sensing unit having constant impedance. In this method, a first electrode is foamed on a first substrate. A second electrode and a third electrode are formed on a second substrate. A supporting layer is formed between the first substrate and the second substrate. A sensing layer is fanned between the second electrode and the third electrode to electrically connect the second electrode and the third electrode, wherein the sensing layer has constant impedance. The first substrate and the second substrate are assembled, such that the first electrode is disposed between the first substrate and the second substrate, and the first electrode contacts the second electrode through a pressing motion.

A touch sensing unit is further introduced herein. The touch sensing unit includes a first substrate, a first electrode, a second substrate, a second electrode, a supporting layer, a third electrode and a sensing layer. The first electrode is disposed on the first substrate. The second substrate is disposed opposite to the first substrate. The first electrode is disposed between the first substrate and the second substrate. The second electrode is disposed on the second substrate, and the first electrode contacts the second electrode through a pressing motion. The supporting layer is disposed between the first substrate and the second substrate. The third electrode is disposed on the second substrate. The sensing layer has constant impedance, and disposed on the second substrate between the second electrode and the third electrode to electrically connect the second electrode and the third electrode.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

In light of the foregoing, the touch sensing unit of the disclosure includes the sensing layer having constant impedance, and the sensing layer does not contact with other components by the user's pressing motion. Therefore, the sensing layer provides constant impedance when the touch sensing unit is touched, and the accuracy, the sensitivity, and the reliability of the touch sensing unit are increased.

Figure 1A:
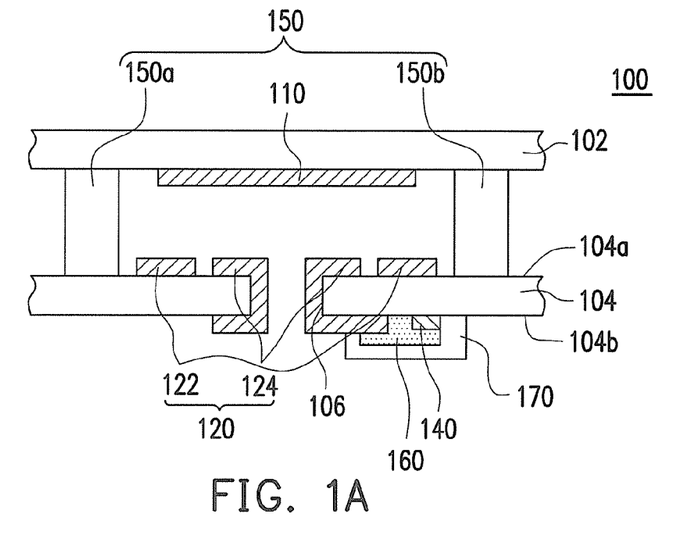
FIG. 1A is a cross-sectional view of a touch sensing unit according to an exemplary embodiment of the disclosure.
Figure 1B:
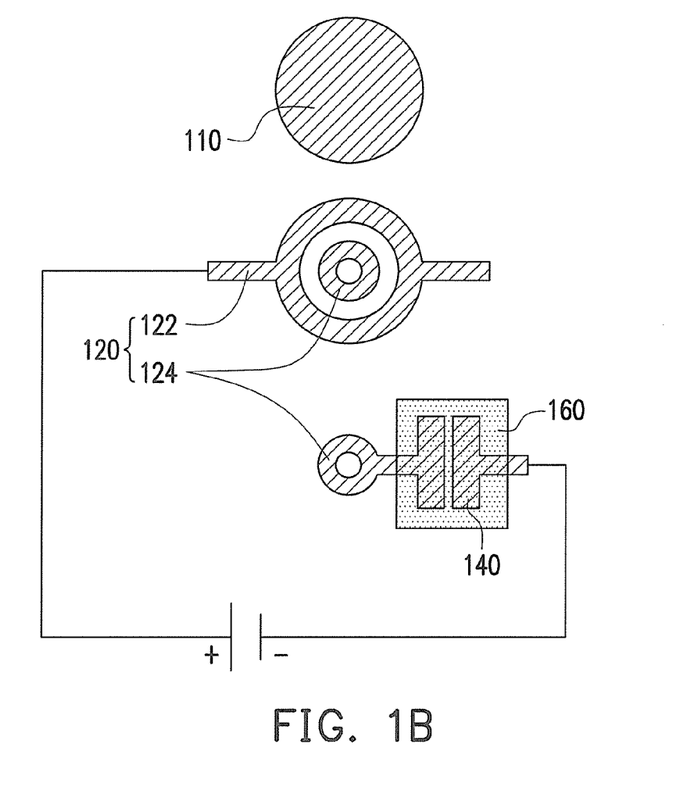
FIG. 1B is a top view of a touch sensing unit of FIG. 1A.

FIG. 1A is a cross-sectional view of a touch sensing unit according to an exemplary embodiment of the disclosure, and FIG. 1B is a top view of a touch sensing unit of FIG. 1A, wherein a first substrate and a second substrate are omitted in FIG. 1B. Referring to FIGS. 1A and 1B, in the present exemplary embodiment, the touch sensing unit 100 includes a first substrate 102, a first electrode 110, a second substrate 104, a second electrode 120, a supporting layer 150, a third electrode 140, and a sensing layer 160. The second substrate 104 is disposed opposite to the first substrate 102. The supporting layer 150 is disposed between the first substrate 102 and the second substrate 104. In the present exemplary embodiment, the second substrate 104 has a first surface 104a and a second surface 104b which are opposite to each other, and the first surface 104a faces the first substrate 102. The second substrate 104 includes a through hole 106 penetrating through the first surface 104a and the second surface 104b. The supporting layer 150 is disposed between the first substrate 102 and the second substrate 104 to maintain a gap therebetween. In the present exemplary embodiment, the first substrate 102 is a flexible printed circuit (FPC) board, and the second substrate 104 is a printed circuit board (PCB) or a FPC board, for example. The supporting layer 150 includes a plurality of spacers 150a, 150b, and a material of the supporting layer 150 can be insulators having flexibility, such as epoxy resin or insulating ink.

Figure 2:
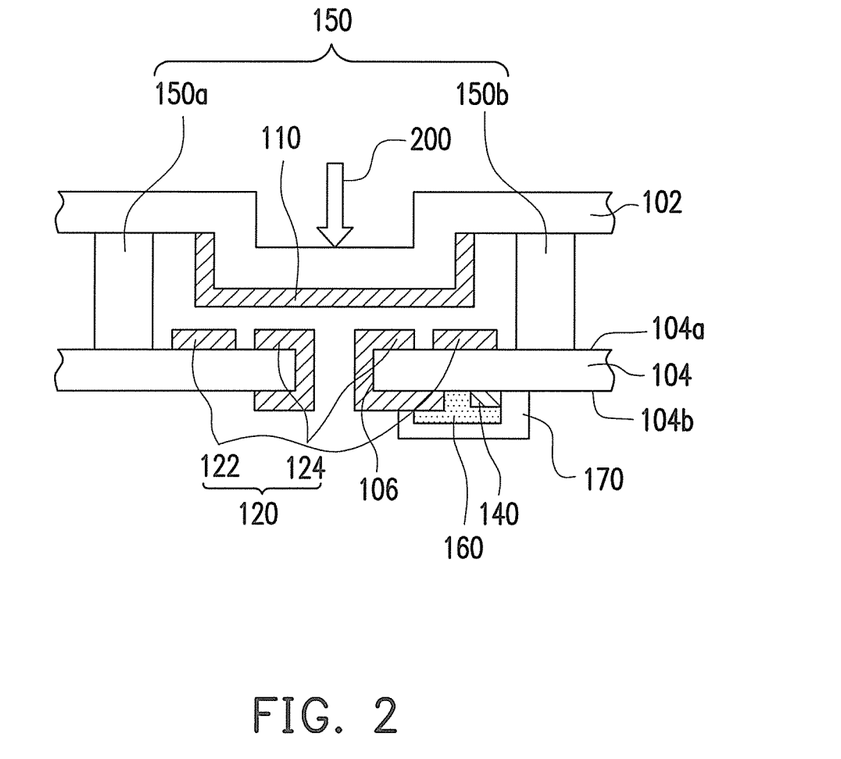
FIG. 2 is a cross-sectional view of a touch sensing unit of FIG. 1A when a pressing motion is performed thereto.

The first electrode 110 is disposed on the first substrate 102. The second electrode 120 is disposed on the second substrate 104, the first electrode 110 is disposed between the first substrate 102 and the second substrate 104, and the first electrode 110 contacts the second electrode 120 through a pressing motion. In the present exemplary embodiment, the first electrode 110 is a block electrode, for example. The second electrode 120 includes a first conductive pattern 122 and a second conductive pattern 124 which are separated and electrically insulated from each other, and the first conductive pattern 122 and the second conductive pattern 124 are electrically connected by contacting with the first electrode 110 through the pressing motion 200, as shown in FIG. 2. In the present exemplary embodiment, the first electrode 110 is a round electrode, the second conductive pattern 124 is surrounded and separated from the first conductive pattern 122, and the first conductive pattern 122 and the second conductive pattern 124 are ring-shaped.

In the present exemplary embodiment, the first conductive pattern 122 is disposed on the first surface 104a of the second substrate 104, the second conductive pattern 124 is disposed on the first surface 104a of the second substrate 104 and extended to the second surface 104b of the second substrate 104 through the through hole 106. Materials of the first electrode 110, the first conductive pattern 122, and the second conductive pattern 124 are copper, indium tin oxide (ITO) or other conductive materials, and the materials of the first electrode 110, the first conductive pattern 122, and the second conductive pattern 124 are identical, for example.

The third electrode 140 is disposed on the second substrate 104. The sensing layer 160 has constant impedance, and disposed on the second substrate 104 between the second electrode 120 and the third electrode 140 to electrically connect the second electrode 120 and the third electrode 140. In the present exemplary embodiment, the sensing layer 160 and the third electrode 140 are disposed on the second surface 104b of the second substrate 104, for example. A material of the third electrode 140 is, for example, copper, indium tin oxide (ITO) or other conductive material. The sensing layer 160 covers the second conductive pattern 124 and the third electrode 140 to electrically connect the second conductive pattern 124 and the third electrode 140. A material of the sensing layer 160 is resistive sensing material, pressing sensing material, capacitive sensing material or other sensing material which provides constant impedance. For example, the sensing layer 160 can include polymer and carbon black powder, and a method of forming the same can be printing. In another exemplary embodiment, the sensing layer 160 can include conductive ink, and shape of the electrode is designed to provide the constant impedance of the sensing layer 160.

In the present exemplary embodiment, the touch sensing unit 100 can further include a cover layer 170, and the cover layer 170 covers the sensing layer 160. Because the sensing layer 160 is covered by the cover layer 170, the sensing layer 160 does not contact other components when the user presses the touch sensing unit 100, and therefore the sensing layer 160 can maintain constant impedance and be prevented from being worn. In addition, the cover layer 170 can also prevent the sensing function of the sensing layer 160 from being affected by the environment. In the present exemplary embodiment, the cover layer 170 is disposed on the second surface 104b of the second substrate 104 and covers the sensing layer 160, and a material of the cover layer 170 is an encapsulant, for example.

Referring to FIG. 2, in the present exemplary embodiment, the current loop is formed between the first conductive pattern 122, the second conductive pattern 124, and the third electrode 140 when a pressing motion 200 is performed. In detail, the first conductive pattern 122 is connected to an anode, the third electrode 140 is connected to a cathode, and the second conductive pattern 124 and the third electrode 140 are electrically connected through the sensing layer 160. In this configuration, the first conductive pattern 122 and the second conductive pattern 124 are electrically connected through the first electrode 110 when the pressing motion 200 is performed to the first electrode 110 by the user. Therefore, the touching is confirmed according to the current loop formed between the first conductive pattern 122, the second conductive pattern 124, and the third electrode 140.

In the present exemplary embodiment, because the touch sensing unit 100 has constant impedance, the touch point is determined by a sensing circuit according to the constant impedance which is not affected by external factors including pressing force and contacting area. Therefore, the complexity of the sensing circuit is reduced and the incorrect signal is prevented, and the accuracy of the touch sensing unit 100 is increased. Moreover, the first electrode 110 contacts the second electrode 120 when the touch sensing unit 100 is touched, and a pull-in effect is generated because the first electrode 110 and the second electrode 120 are conductive materials which have material similarity. Accordingly, the impedance between the first electrode 110 and the second electrode 120 is lowered and the conductance therebetween is increased, and thus the sensitivity of the touch sensing unit 100 is increased. In addition, components such as electrodes do not contact the sensing layer 160 when the touch sensing unit 100 is touched, and thus the sensing layer 160 is prevented from being worn and the sensing layer 160 maintains constant impedance. Accordingly, the reliability of the touch sensing unit 100 is increased. In summary, the touch sensing unit 100 of the present exemplary embodiment has superior accuracy, sensitivity, and reliability. It is noted that although only one touch sensing unit 100 is illustrated in the present exemplary embodiment, but the present embodiment is not limited thereto. In another exemplary embodiment, as shown in FIG. 5E, a plurality of touch sensing units 100 are arranged in array to form a touch sensing array 10, and the touch sensing array 10 has the advantages of large-area touch sensing and multi-touch sensing features and can be applied in flat or flexible touch devices, such as sensing mattresses, game mats and electronic whiteboards. Similarly, the touch sensing array 10 also has superior accuracy, sensitivity, and reliability, and the incorrect signal is prevented.

In the above exemplary embodiments, the second electrode 120 has double ring structure, but the present embodiment is not limited thereto. In other words, the first electrode and the second electrode can have other shape, such as rectangular, diamond, triangular and elliptical. In addition, the first conductive pattern 122 and the second conductive pattern 124 of the second electrode 120 can also have other shape or the second electrode 120 can be substantially a block electrode.

Figure 3A:
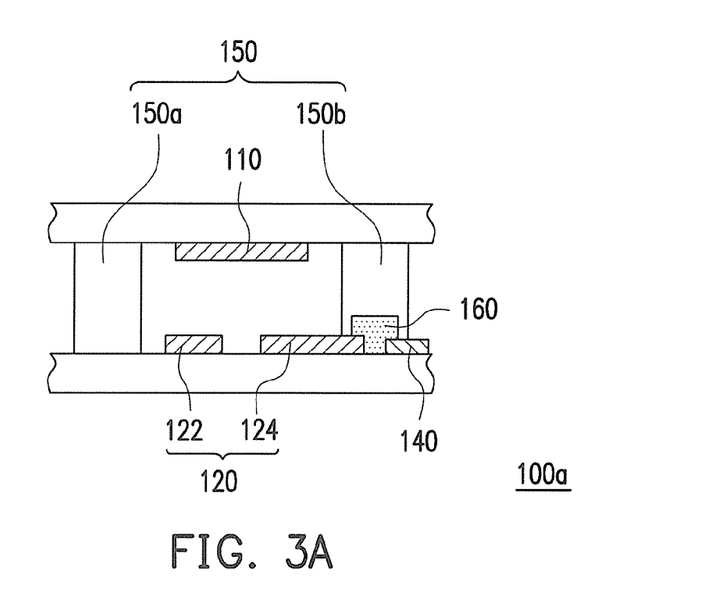
FIG. 3A is a cross-sectional view of a touch sensing unit according to another exemplary embodiment of the disclosure.
Figure 3B:
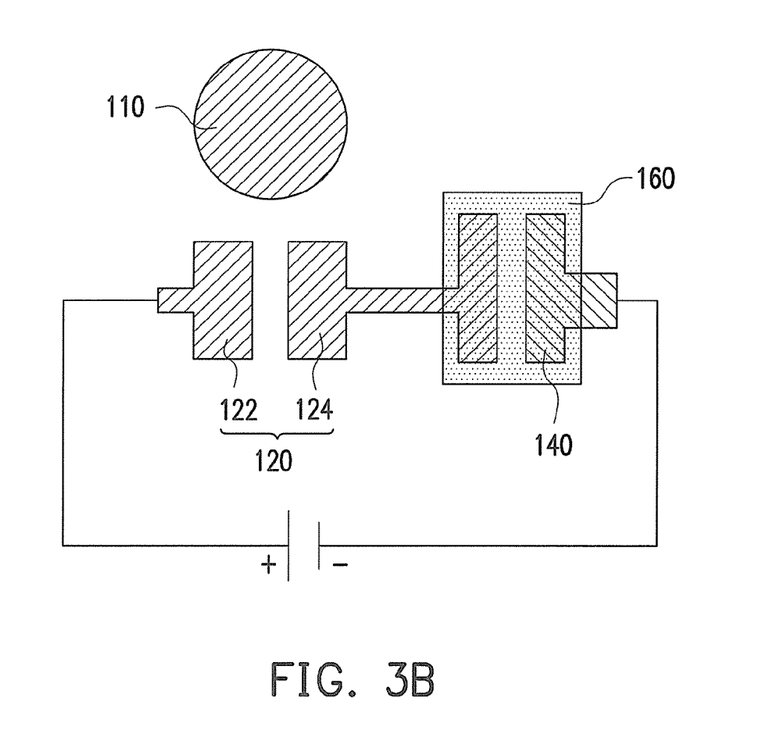
FIG. 3B is a top view of a touch sensing unit of FIG. 3A.

FIG. 3A is a cross-sectional view of a touch sensing unit according to another exemplary embodiment of the disclosure, and FIG. 3B is a top view of a touch sensing unit of FIG. 3A, wherein a first substrate and a second substrate are omitted in FIG. 3B. Referring to FIGS. 3A and 3B, in the present exemplary embodiment, the components of the touch sensing units 100a are similar to that of the touch sensing units 100 of FIGS. 1A and 1B, thus only the different parts are described hereinafter. In the touch sensing units 100a of the present exemplary embodiment, the second electrode 120 includes a first conductive pattern 122 and a second conductive pattern 124 which are separated and electrically insulated from each other. In the present exemplary embodiment, the first conductive pattern 122 and the second conductive pattern 124 are strip electrodes, and the first conductive pattern 122, the second conductive pattern 124, the third electrode 140, and the sensing layer 160 are disposed on a first surface 104a of the second substrate 104. The supporting layer 150 is disposed on and covers the sensing layer 160, for example, and thus the sensing layer 160 is prevented from contacting with the first substrate 102 or the first electrode 110 when a pressing motion is not performed. The supporting layer 150 includes a plurality of spacers 150a, 150b, and one of the spacers 150a, 150b is disposed on and covers the sensing layer 160, for example. In other exemplary embodiments, a cover layer can be additionally formed on the sensing layer 160, as the cover layer 170 shown in FIG. 1A, and thus the sensing layer 160 is prevented from contacting with the first substrate 102 or the first electrode 110 when a pressing motion is not performed.

In the present exemplary embodiment, the first conductive pattern 122 and the second conductive pattern 124 are electrically connected to each other by contacting with the first electrode 110 through the pressing motion (not shown), and the second conductive pattern 124 and the third electrode 140 are electrically connected through the sensing layer 160. When a pressing motion (not shown) is performed, the current loop is formed between the first conductive pattern 122, the second conductive pattern 124, and the third electrode 140, for example. In detail, the first conductive pattern 122 is connected to an anode, the third electrode 140 is connected to a cathode, and the second conductive pattern 124 and the third electrode 140 are electrically connected through the sensing layer 160. In this configuration, when the pressing motion (not shown) is performed to the first electrode 110 by the user, the first conductive pattern 122 and the second conductive pattern 124 are electrically connected by contacting with the first electrode 110. Therefore, the touching is confirmed according to the current loop which is formed between the first conductive pattern 122, the second conductive pattern 124, and the third electrode 140.

Figure 4A:
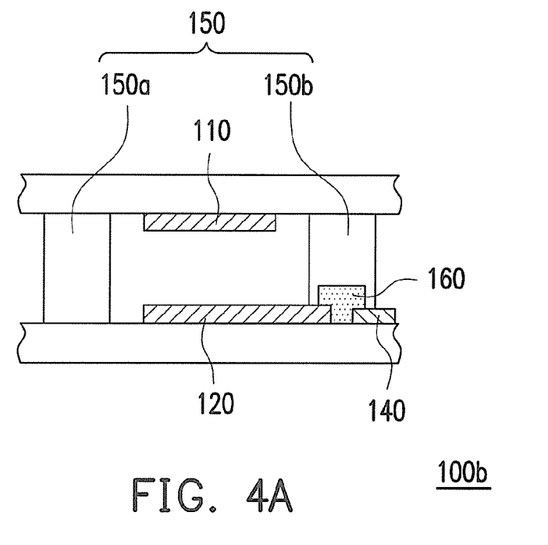
FIG. 4A is a cross-sectional view of a touch sensing unit according to still another exemplary embodiment of the disclosure.
Figure 4B:
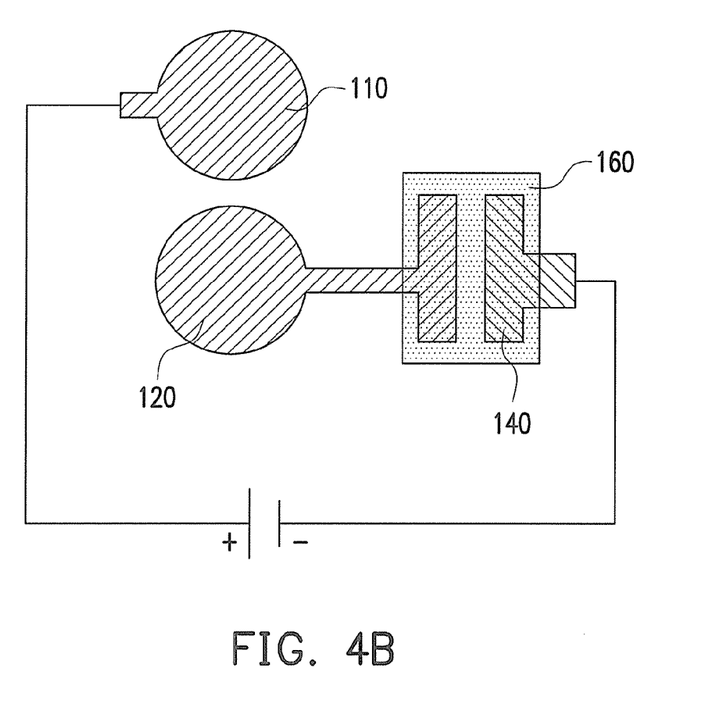
FIG. 4B is a top view of a touch sensing unit of FIG. 4A.

FIG. 4A is a cross-sectional view of a touch sensing unit according to still another exemplary embodiment of the disclosure, and FIG. 4B is a top view of a touch sensing unit of FIG. 4A, wherein a first substrate and a second substrate are omitted in FIG. 4B. Referring to FIGS. 4A and 4B, in the present exemplary embodiment, the components of the touch sensing units 100b are similar to that of the touch sensing units 100a of FIGS. 3A and 3B, thus only the different parts are described hereinafter. In the touch sensing units 100b of the present exemplary embodiment, the first electrode 110 and the second electrode 120 are block electrodes, and the first electrode 110 and the second electrode 120 are in a round shape, for example. In the present exemplary embodiment, the first electrode 110 and the second electrode 120 are electrically connected to each other through the pressing motion (not shown), and the second electrode 120 and the third electrode 140 are electrically connected through the sensing layer 160. In the present exemplary embodiment, when a pressing motion (not shown) is performed, the current loop is formed between the first electrode 110, the second electrode 120, and the third electrode 140. In detail, the first electrode 110 is connected to an anode, the third electrode 140 is connected to a cathode, and the second electrode 120 and the third electrode 140 are electrically connected through the sensing layer 160. In this configuration, when the pressing motion (not shown) is performed to the first electrode 110 by the user, the first electrode 110 contacts and the second electrode 120, and thus they are electrically connected. Therefore, the touching is confirmed according to the current loop which is formed between the first electrode 110, the second electrode 120, and the third electrode 140.

Figure 5A:
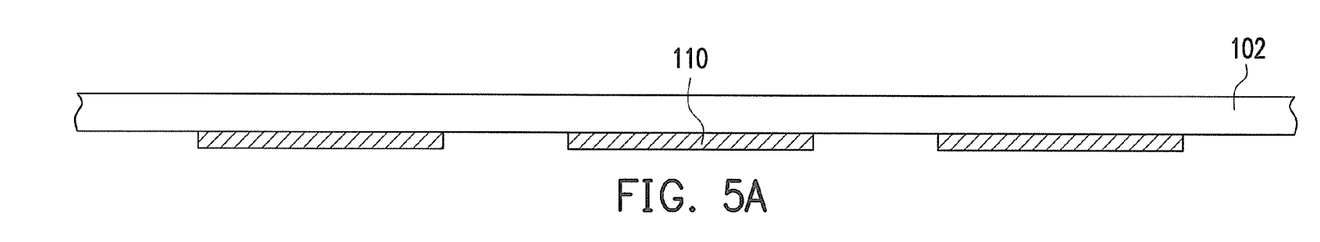
FIGS. 5A to 5E are cross-sectional views of a method for manufacturing a touch sensing unit of FIGS. 1A and 1B according to an exemplary embodiment of the disclosure.
Figure 5B:
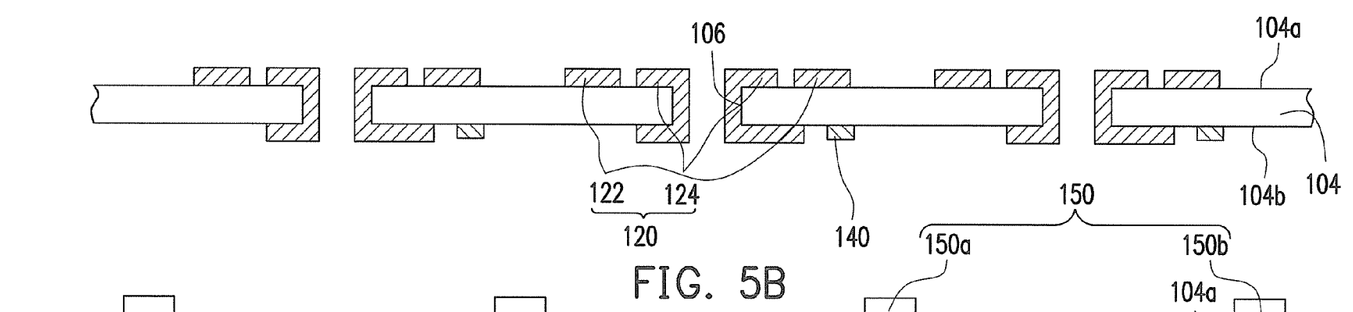
Figure 5C:
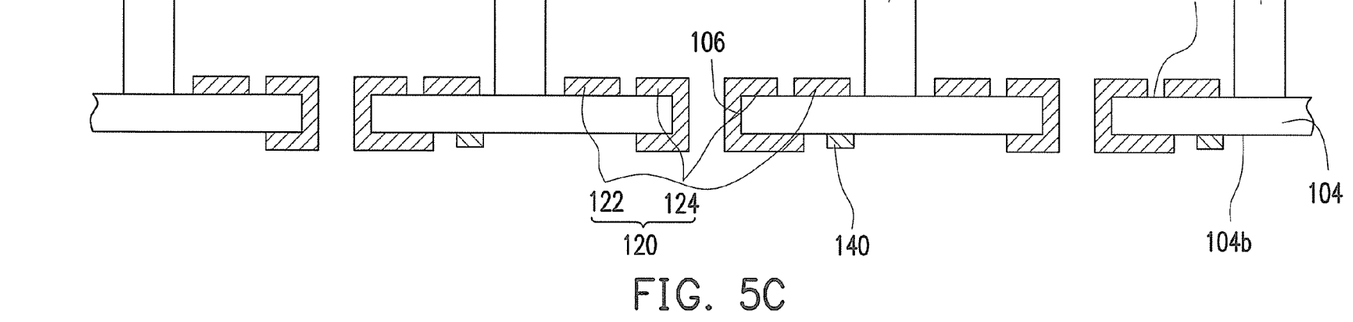
Figure 5D:
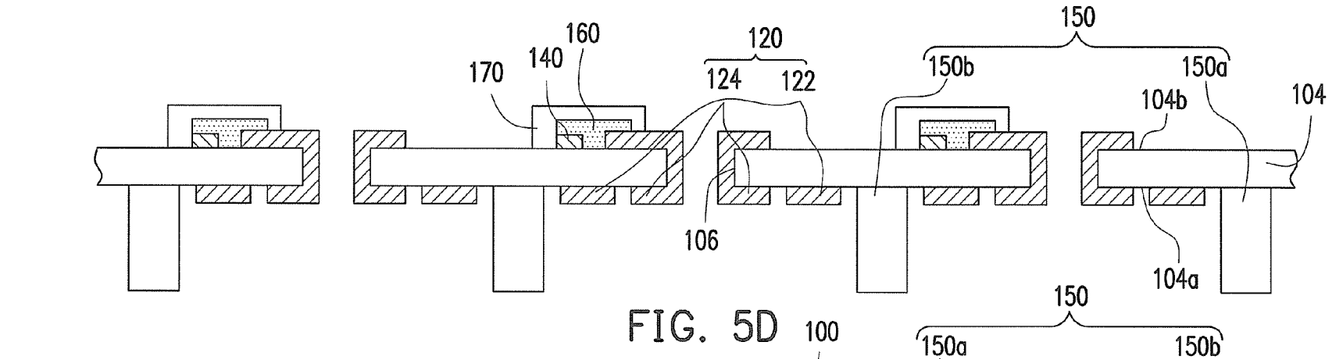
Figure 5E:
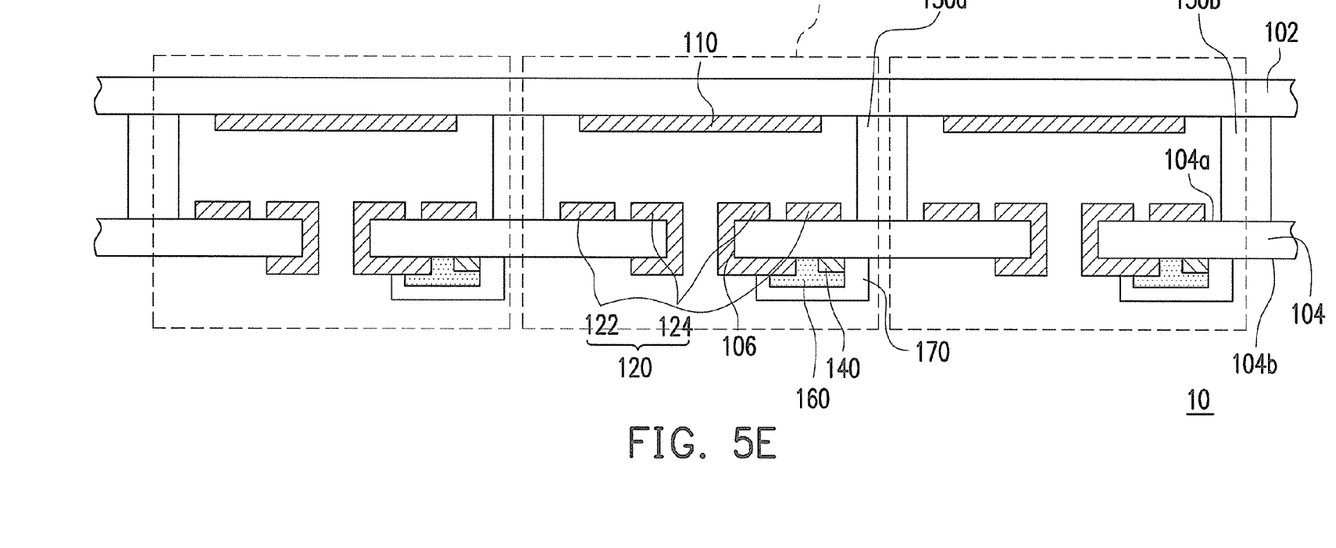

FIGS. 5A to 5E are cross-sectional views of a method for manufacturing a touch sensing unit of FIGS. 1A and 1B according to an exemplary embodiment of the disclosure. It is noted that a plurality of touch sensing units 100 are illustrated in FIGS. 5A to 5E and the touch sensing units 100 constitute a touch sensing array 10. Referring to FIG. 5A, first, a first electrode 110 is formed on a first substrate 102. The first substrate 102 is, for example, a FPC board. The first electrode 110 is a round electrode, for example. A method of forming the first electrode 110 can be the photolithographic process and etching process, and a material of the first electrode 110 can be copper, indium tin oxide (ITO) or other conductive material.

Referring to FIGS. 5B to 5D, a second electrode 120, a third electrode 140, and a supporting layer 150 are then formed on a second substrate 104, wherein the second electrode 120 and the third electrode 140 are electrically connected. In the present exemplary embodiment, this step is as follows. Referring to FIG. 5B, first, a second substrate 104 is provided, and the second substrate 104 includes a through hole 106 penetrating through a first surface 104a and a second surface 104b. The second substrate 104 is, for example, a PCB. Next, a first conductive pattern 122 and a second conductive pattern 124 which are separated are formed on the first surface 104a of the second substrate 104, wherein the second conductive pattern 124 is extended to the second surface 104b through the through hole 106. The first conductive pattern 122 and the second conductive pattern 124 constitute the second electrode 120. In the present exemplary embodiment, the first conductive pattern 122 and the second conductive pattern 124 are circular electrodes, for example. Methods of forming the first conductive pattern 122 and the second conductive pattern 124 can be the photolithographic process and etching process, and materials of the first conductive pattern 122 and the second conductive pattern 124 can be copper, indium tin oxide (ITO) or other conductive materials.

Then, a third electrode 140 is formed on the second surface 104b of the second substrate 104. In the present exemplary embodiment, the third electrode 140 is a strip electrode, for example. A method of forming the third electrode 140 can be the photolithographic process and etching process, and a material of the third electrode 140 can be copper, indium tin oxide (ITO) or other conductive material.

Referring to FIG. 5C, thereafter, a supporting layer 150 is formed between the first substrate 102 and the second substrate 104. In the present exemplary embodiment, the supporting layer 150 is formed on the first surface 104a of the second substrate 104. The supporting layer 150 includes a plurality of spacers 150a, 150b, and one of the spacers 150a, 150b is disposed on the first surface 104a of the second substrate 104, for example. A method of forming the supporting layer 150 can be hot press process, and a material of the supporting layer 150 can be epoxy resin.

Referring to FIG. 5D, afterwards, a sensing layer 160 is formed between the second electrode 120 and the third electrode 140 to electrically connect the second electrode 120 and the third electrode 140, wherein the sensing layer 160 has constant impedance. In the present exemplary embodiment, the sensing layer 160 is formed on the second surface 104b of the second substrate 104 and covers the second electrode 120 and the third electrode 140, for example. A method of forming the sensing layer 160 can be printing, and a material of the sensing layer 160 can be resistive sensing material, pressing sensing material, capacitive sensing material or other sensing material which provides constant impedance. In the present exemplary embodiment, a cover layer 170 can be further formed on the second substrate 104 to cover the sensing layer 160. The cover layer 170 is formed on the second surface 104b of the second substrate 104, for example. A method of forming the cover layer 170 can be printing, and a material of the cover layer 170 can be an encapsulant.

Referring to FIG. 5E, next, the first substrate 102 and the second substrate 104 are assembled, such that the first electrode 110 is disposed between the first substrate 102 and the second substrate 104, and the first electrode 110 contacts the second electrode 120 through a pressing motion (not shown). In the present exemplary embodiment, this step is as follows. The first electrode 110 on the first substrate 102 faces the first surface 104a of the second substrate 104, and then the first substrate 102 is aligned with the second substrate 104 to align the first electrode 110 with the second electrode 120. After that, the first substrate 102 and the second substrate 104 are, for example, attached for assembling. So far, the fabrication of the touch sensing unit 100 and the touch sensing array 10 are roughly completed.

In the present exemplary embodiment, the method for manufacturing the touch sensing unit 100 and the touch sensing array 10 is compatible with conventional PCB process, and has advantages of technical maturity and low cost. Particularly, the touch sensing unit 100 has superior accuracy, sensitivity, and reliability, and therefore the touch sensing array 10 has the advantages of large-area touch sensing and multi-touch sensing features and can be applied in flat or flexible touch devices, such as sensing mattresses, game mats and electronic whiteboards.

In summary, the touch sensing unit of the disclosure has constant impedance, and thus the touch point is determined by a processing circuit according to the constant impedance, which is not affected by external factors including pressing force and contacting area. Therefore, the complexity of the processing circuit is reduced and the incorrect signal is prevented, and the accuracy of the touch sensing unit is increased. In addition, the contact impedance between the electrodes is lowered and the conductance therebetween is increased, and thus the touch sensing unit has superior sensitivity. Moreover, components such as electrodes do not contact the sensing layer when the touch sensing unit is touched, and thus the sensing layer is prevented from being worn and the sensing layer maintains constant impedance. Accordingly, the reliability of the touch sensing unit is increased.

Furthermore, the method for manufacturing the touch sensing unit is compatible with conventional PCB process, and thus has advantages of technical maturity and low cost. Particularly, the method for manufacturing the touch sensing unit is suitable for manufacturing the touch sensing array to accomplish a large-area touch sensing and multiple touch sensing devices.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A touch sensing unit, comprising:
a first substrate;
a first electrode, disposed on the first substrate;
a second substrate, disposed opposite to the first substrate, wherein the first electrode is disposed between the first substrate and the second substrate;
a second electrode, disposed on the second substrate, wherein the first electrode contacts the second electrode through a pressing motion;
a supporting layer, disposed between the first substrate and the second substrate;
a third electrode, disposed on the second substrate; and
a sensing layer, having constant impedance, and disposed on the second substrate between the second electrode and the third electrode to electrically connect the second electrode and the third electrode.

2. The touch sensing unit as claimed in claim 1, further comprising a cover layer, disposed on the second substrate and covering the sensing layer.

3. The touch sensing unit as claimed in claim 1, wherein the second electrode comprises a first conductive pattern and a second conductive pattern, and the first conductive pattern and the second conductive pattern are electrically connected to each other by contacting with the first electrode through the pressing motion.

4. The touch sensing unit as claimed in claim 3, wherein the second substrate includes a through hole, the first conductive pattern is disposed on a first surface of the second substrate, the second conductive pattern is disposed on the first surface of the second substrate and extended to a second surface of the second substrate through the through hole, the sensing layer and the third electrode are disposed on the second surface of the second substrate, and the first surface faces the first substrate and the second surface is opposite to the first surface.

5. The touch sensing unit as claimed in claim 4, wherein the second conductive pattern is surrounded and separated from the first conductive pattern.

6. The touch sensing unit as claimed in claim 4, further comprising a cover layer, disposed on the second surface of the second substrate and covering the sensing layer.

7. The touch sensing unit as claimed in claim 3, wherein the first conductive pattern, the second conductive pattern, the third electrode, and the sensing layer are disposed on a first surface of the second substrate, and the first surface faces the first substrate.

8. The touch sensing unit as claimed in claim 7, wherein the supporting layer comprises a plurality of spacers, and one of the spacers is disposed on the first surface of the second substrate.

9. The touch sensing unit as claimed in claim 3, wherein the first conductive pattern is connected to an anode, and the third electrode is connected to a cathode.

10. The touch sensing unit as claimed in claim 1, wherein the second electrode, the third electrode, and the sensing layer are disposed on a first surface of the second substrate, and the first surface faces the first substrate.

11. The touch sensing unit as claimed in claim 10, wherein the supporting layer comprises a plurality of spacers, and one of the spacers is disposed on and covers the sensing layer.

12. The touch sensing unit as claimed in claim 10, wherein the first electrode is connected to an anode, and the third electrode is connected to a cathode.

13. A method for manufacturing a touch sensing unit, comprising:
- forming a first electrode on a first substrate;
- forming a second electrode and a third electrode on a second substrate;
- forming a supporting layer between the first substrate and the second substrate;
- forming a sensing layer between the second electrode and the third electrode to electrically connect the second electrode and the third electrode, wherein the sensing layer has constant impedance; and
- assembling the first substrate and the second substrate, such that the first electrode is disposed between the first substrate and the second substrate, and the first electrode contacts the second electrode through a pressing motion.

14. The method for manufacturing a touch sensing unit as claimed in claim 13, further comprising forming a cover layer on the second substrate to cover the sensing layer.

15. The method for manufacturing a touch sensing unit as claimed in claim 13, wherein the second electrode comprises a first conductive pattern and a second conductive pattern, and the first conductive pattern and the second conductive pattern are electrically connected to each other by contacting with the first electrode through the pressing motion.

16. The method for manufacturing a touch sensing unit as claimed in claim 15, wherein the method of foaming the second electrode and the third electrode comprises:
- forming the first conductive pattern and the second conductive pattern on the second substrate;
- forming the third electrode on the second substrate; and
- forming the sensing layer between the second conductive pattern and the third electrode to electrically connect the second conductive pattern and the third electrode.

17. The method for manufacturing a touch sensing unit as claimed in claim 16, wherein the second substrate includes a through hole, the first conductive pattern is disposed on a first surface of the second substrate, the second conductive pattern is disposed on the first surface of the second substrate and extended to a second surface of the second substrate through the through hole, the sensing layer and the third electrode are disposed on the second surface of the second substrate, the first surface faces the first substrate after the assembling step, and the second surface is opposite to the first surface.

18. The method for manufacturing a touch sensing unit as claimed in claim 17, wherein the second conductive pattern is surrounded and separated from the first conductive pattern.

19. The method for manufacturing a touch sensing unit as claimed in claim 16, wherein the first conductive pattern, the second conductive pattern, the third electrode, and the sensing layer are formed on a first surface of the second substrate, and the first surface faces the first substrate after the assembling step.

20. The method for manufacturing a touch sensing unit as claimed in claim 19, wherein the supporting layer comprises a plurality of spacers, and one of the spacers is formed on and covers the sensing layer.

21. The method for manufacturing a touch sensing unit as claimed in claim 13, wherein the second electrode, the third electrode, and the sensing layer are disposed on a first surface of the second substrate, and the first surface faces the first substrate after the assembling step.

\* \* \* \* \*